United States Patent
Clemens et al.

(10) Patent No.: US 10,018,505 B2
(45) Date of Patent: Jul. 10, 2018

(54) GEIGER MODE APD LIGHT RECEIVER HAVING AN ACTIVE READOUT FORMING A VIRTUAL SHORT-CIRCUIT

(71) Applicant: SICK AG, Waldkirch (DE)

(72) Inventors: Klaus Clemens, Waldkirch (DE); Gottfried Hug, Waldkirch (DE); Stefan Seitz, Waldkirch (DE); Sebastian Tschuch, Waldkirch (DE)

(73) Assignee: SICK AG, Waldkirch (DE)

( * ) Notice: Subject to any disclaimer, the term of this patent is extended or adjusted under 35 U.S.C. 154(b) by 0 days.

(21) Appl. No.: 15/216,086

(22) Filed: Jul. 21, 2016

(65) Prior Publication Data
US 2017/0030769 A1    Feb. 2, 2017

(30) Foreign Application Priority Data
Jul. 27, 2015  (EP) ..................... 15178508

(51) Int. Cl.
| G01J 1/44 | (2006.01) |
| G01J 1/46 | (2006.01) |
| G01S 7/486 | (2006.01) |
| H01L 31/02 | (2006.01) |
| H01L 27/146 | (2006.01) |
| H01L 31/107 | (2006.01) |

(52) U.S. Cl.
CPC . *G01J 1/44* (2013.01); *G01J 1/46* (2013.01); *G01S 7/4863* (2013.01); *H01L 27/14643* (2013.01); *H01L 31/02005* (2013.01); *H01L 31/02027* (2013.01); *H01L 31/107* (2013.01); *G01J 2001/4466* (2013.01)

(58) Field of Classification Search
CPC ............. G01J 1/44; G01J 2001/4466; H01L 31/02027; H01L 31/107

USPC ....................... 250/214 R, 214.1
See application file for complete search history.

(56) References Cited

U.S. PATENT DOCUMENTS 6,020,593 A * 2/2000 Chow ............... H04B 10/032
                                                 250/214 LS

FOREIGN PATENT DOCUMENTS

| GB | 2451678 A | 2/2009 |
| WO | 2011117309 A2 | 9/2011 |

OTHER PUBLICATIONS

European Search Report dated Jan. 25, 2016 corresponding to application No. 15178508.6-1812.

* cited by examiner

*Primary Examiner* — Que T Le
(74) *Attorney, Agent, or Firm* — Nath, Goldberg & Meyer; Jerald L. Meyer

(57) ABSTRACT

A light receiver (10, 50) having a plurality of avalanche photo diode elements (10, 12a-c) which are biased with a bias voltage greater than a breakthrough voltage and are thus operated in a Geiger mode in order to trigger a Geiger current upon light reception, and having a signal detection circuit (50) for reading out the avalanche photo diode elements (10, 12a-c), wherein the signal detection circuit (50) comprises an active coupling element (52) having an input (54) connected to the avalanche photo diode elements (10, 12a-c) and an output (56), the active coupling element (52) mapping the Geiger current at the input (54) to a measuring current corresponding to the Geiger current in its course and level, wherein the input (54) forms a virtual short-circuit for the Geiger current with respect to a potential (ground, $-U_{BE}$; $U_{const}-U_{BE}$), and the output (56) is decoupled from the input (54).

16 Claims, 10 Drawing Sheets

GEIGER MODE APD LIGHT RECEIVER HAVING AN ACTIVE READOUT FORMING A VIRTUAL SHORT-CIRCUIT

TECHNICAL FIELD

The invention relates to a light receiver having a plurality of avalanche photo diode elements operated in a Geiger mode and a readout method.

BACKGROUND

The function of a light receiver is to generate an electrical signal from incident reception light. The detection sensitivity of simple photo diodes is not sufficient in many applications. In an avalanche photo diode (APD), the incident light triggers a controlled avalanche breakthrough (avalanche effect). This multiplies the charge carriers generated by incident photons, and a photo current is produced which is proportional to the light reception level but significantly larger than in a simple PIN diode. In a so-called Geiger mode, the avalanche photo diode is biased above the breakthrough voltage so that even a single charge carrier generated by a single photon can trigger an avalanche, which subsequently recruits all available charge carriers due to the strong field. Hence, the avalanche diode counts individual events like a Geiger counter from which the name is derived. Geiger mode avalanche photo diodes are also called SPAD (Single Photon Avalanche Diode). Another common name is SiPM (Silicon Photo Multiplier), where silicon is a widespread, but not the only used semiconductor and SiPM denotes an entire array of SPADs.

The high radiation sensitivity of SPADs is used in a number of applications. These include medical technology like CT, MRI, or blood tests, optical measuring technology like spectroscopy, distance measurement and three-dimensional imaging, radiation detection in nuclear physics, or uses in telescopes for astrophysics.

Geiger APDs or SPADs thus are very fast, highly sensitive photo diodes on a semiconductor basis. One drawback of the high sensitivity is that not only a measurement photon, but also a weak interference event from ambient light, optical cross talk or dark noise may trigger the avalanche breakthrough. The interference event contributes to the measurement signal with the same relatively strong signal as the received measurement light and is indistinguishable within the signal. The avalanche diode subsequently is insensitive for a dead time of about 5 to 100 ns and is unavailable for further measurements during that time. It is therefore common to interconnect and statistically evaluate multiple SPADs.

In order to actually make use of the signal, it has to be tapped or read out from the SPAD detector element. This is shown in FIG. 1 in a very rough block diagram. A signal detection circuit 150 which outputs the measurement signal in a manner which can be processed in subsequent circuits is connected to the actual detector element 110 having one or usually a plurality of SPADs Looking at known solutions, in a first step buffered and direct signal detection are to be distinguished. FIG. 2a shows an ideal measurement signal for direct signal detection which enables to analyze the time course of the avalanche breakthroughs and subsequent charging. The sharp falling edges are respective detection events where the bias voltage over the SPAD abruptly breaks down due to incident photons, and then slowly recovers with a time constant in a range of 5 ns as discussed above. The avalanche breakthrough obviously is a very fast event, so that an evaluation of the Geiger current in principle enables fast response times in the range well below 1 ns. However, it is not possible to actually make use of the ideal measurement signal in practice with known signal detection circuits.

In buffered signal detection with digital characteristics, the SPAD signal itself is not passed to the outside, but is evaluated with a threshold in an integrated buffer stage. This is illustrated in FIG. 2b in an example. Although a very usable signal is provided for further processing, there is a loss of information caused by the threshold evaluation. In particular, events occurring too early within the sub-threshold range of the charge are completely lost. This explains why buffered signal detection is less useful for high-frequency signals.

In direct signal detection, the measurement signal should represent the course of the actual signal within the SPAD, i.e. ideally the course according to FIG. 2a. FIGS. 3a-c show some circuits conventionally used for that end. In all cases, the performance is insufficient in particular for high-frequency signals.

In a simple resistor coupling according to FIG. 3a, the signal current or Geiger current is directly converted into a corresponding measurement signal voltage by a connected load resistor (impedance $Z_{Signal}$). The performance is very limited especially for high-frequency signals and is significantly affected by parasitic capacitances, because the combination of load resistor and parasitic capacitances is a low pass.

An amplifier circuit with a transimpedance amplifier according to FIG. 3b is often used in the prior art. The illustration is simplified in that these amplifiers usually have multiple stages. A feedback resistor ($Z_{Signal}$) between output of the last amplifier stage and input of the first amplifier stage feeds an attenuated output signal back to the amplifier input and forms a negative feedback for negative gain. Already in a mid-frequency range, i.e. some MHz, the negative feedback of several stages leads to considerable phase shifts because the individual latencies of the amplifier stages add up. Thus, a desired virtual ground at the amplifier input is no longer achieved for higher frequencies. The input resistance is approximately calculated as $$Z_{in}=Z_{Signal}/(1+\text{gain}).$$

With increasing frequency, the gain decreases, and the input resistance increases. The increase of the resistance with frequency corresponds to an inductive behavior. Combined with parasitic input capacitances, a resonant circuit is formed, which may lead to instability and a tendency to oscillate.

A further problem of signal detection with a transimpedance amplifier is the matching of the input signal coming from the SPAD detector and the active part of the amplifier. Signal voltages at the virtual ground which also is the input of the amplifier are minimal. At the same time high input impedances for the amplifier element, e.g. an operational amplifier, are common. As a consequence, only very small signal powers arrive at the active part of the amplifying element, namely, the product of the minimal signal voltage at the virtual ground and the input current being very small due to the input impedance. The major part of the signal current coming from the SPAD detector flows through the feedback resistor and thus is not available for the amplifying element in the first place. This unfavorable coupling results in a poor signal-to-noise-ratio.

A third conventional solution shown in FIG. 3c is based on impedance matching using transformers, in this case high-frequency transformers called balun transformers. Such transformers are only suitable up to one GHz. In practice, even this frequency range is not available, because it is only an ideal value which is not achieved since the circuit impedances deviate from 50 Ohm due to stray inductances and parasitic capacitances. There are also variants of transmission line transformers for higher frequencies up to about 3 GHz and special cases like the Guanella transformer. However, they have other unfavorable properties rendering them unsuitable for optimal signal detection, for example because they cannot be operated as an autotransformer or only allow application in certain impedance ranges which do not match a SPAD detector.

WO 2011/117309 A2 proposes to provide a third electrode at the SPAD detector, in addition to the anode and cathode for applying the bias voltage, as a capacitively coupled output for the Geiger current. This is to prevent delaying the readout by circuit elements of the biasing. However, the document does not deal with the actual signal detection.

SUMMARY

It is therefore an object of the invention to provide a light receiver providing an improved measurement signal.

This object is satisfied by a light receiver having a plurality of avalanche photo diode elements which are biased with a bias voltage greater than a breakthrough voltage and are thus operated in a Geiger mode in order to trigger a Geiger current upon light reception, and having a signal detection circuit for reading out the avalanche photo diode elements, wherein the signal detection circuit comprises an active coupling element having an input connected to the avalanche photo diode elements and an output, the active coupling element mapping the Geiger current at the input to a measuring current corresponding to the Geiger current in its course and level, wherein the input forms a virtual short-circuit for the Geiger current with respect to a potential, and the output is decoupled from the input.

It is also satisfied by a readout method for avalanche photo diode elements which are biased with a bias voltage greater than a breakthrough voltage and are thus operated in a Geiger mode and trigger a Geiger current upon light reception, wherein the Geiger current flows through a connection between avalanche photo diode element and an input of an active coupling element due to a virtual short-circuit with respect to a potential, wherein, in the coupling element, the Geiger current is mapped to a measuring current corresponding to the Geiger current in its course and level at an output of the coupling element, and wherein the output is decoupled from the input so that the Geiger current is unaffected by further processing of the measuring current.

The avalanche photo diode elements in Geiger mode, or SPADs, virtually act like highly light sensitive switches which trigger a Geiger current upon light incidence. The invention is based on the idea that existing solutions for signal detection of the avalanche photo diodes are not capable, due to insufficiently optimized circuits, to reflect the very fast processes of an avalanche breakthrough in the measurement signal. The invention therefore uses an active coupling element, i.e. not only passive elements like a resistor or a transformer. The coupling element provides a virtual short-circuit for the Geiger current at its input with reference to a potential which preferably is fixed. In practice, this is only possible down to some Ohm or fractions of an Ohm. However, it means that the Geiger current flows almost completely from the detector, i.e. the respective triggering avalanche photo diode element, into the signal detection circuit and further through the short-circuit, unlike for example in case of a measurement resistor as described in the introduction. Therefore, the parasitic capacitance formed by the plurality of SPAD cells at the output of the SiPM (plurality of interconnected SPADs) can no longer operate as a low pass. There will be virtually no recharging processes in the parasitic capacitances any more. The fast, high-frequency Geiger currents can flow essentially freely to the amplifying element.

Furthermore, the coupling element at its output actively generates a measuring current which corresponds to the Geiger current and thus in particular has the same temporal course. The coupling element can also provide through amplification that the measurement has a level suitable for further processing. At the same time, the measuring current is almost completely decoupled from the Geiger current by the active coupling element. The further processing of the measuring current therefore does not affect the Geiger current.

The invention has the advantage that the performance of the light detector is significantly improved, especially with regard to its speed. Due to the direct signal detection, the course of the Geiger current remains accessible for the further processing. This still works for high frequencies and thus for example very short pulses. Since the current available with the detection event can completely flow into the active coupling element, there is an optimal amplification with a very good signal-to-noise ratio.

SPADs have a very high sensitivity, but this advantage as of yet had the price of doing without a good high-frequency performance. The invention provides a combination of high sensitivity and bandwidth. The signal detection circuit is compact and can even be integrated and has a good price-performance ratio. Overall, not only are known applications improved, but also new applications for SPAD technology are made accessible.

The course of the measuring current preferably deviates from the Geiger current only for fluctuations in a higher Gigahertz range, in particular above a range of two GHz or three GHz. In this specification, the terms preferred or preferably refer to an advantageous, but completely optional feature. The mapping of the Geiger current to the measuring current shows clearly discernable frequency-related deviations only for frequencies of the incident light signal above several GHz. This is made possible by the active coupling element. In contrast, for any of the known solutions as discussed in the introduction, the measurement signal decreases by several decades even for medium frequencies of some hundred MHz, or of one GHz at the latest. Therefore, it is possible due to the invention to resolve pulses and edges also in a sub-nanosecond range with a SPAD detector.

Preferably, a measurement circuit is connected to the output. The measurement circuit is used to further process the measuring current. The measurement circuit may again be a simple measurement resistor, since the measurement resistor does not have an impact on the Geiger current any more due to the decoupling in the coupling element. The decoupling of course has the same effect for other possible measurement circuits, like amplification stages or evaluation units.

The signal detection circuit preferably comprises a constant current source connected to the coupling element for setting its operating point. In a ground state, there flows a standby current, and this continuous current is superimposed by the Geiger current during a detection event. The constant current source may alternatively be a passive resistor.

The coupling element preferably is configured to maintain a constant voltage at the input side. When a Geiger current flows, an output current has to flow through the coupling element from the output in order to maintain the voltage. This maps the Geiger current at the input to a corresponding measuring current at the output.

The coupling element preferably comprises a transistor. In particular, this is exactly one transistor, and more preferably the coupling element consists of the transistor. The coupling element therefore is single-staged, not multi-staged as for example a transimpedance amplifier commonly used for readout. The technical design of the transistor is not limited and includes bipolar transistors or field effect transistors in their various configurations. However, preferably a high-frequency transistor should be used in order to actually achieve the advantages according to the invention of a large bandwidth of the light receiver.

The transistor preferably is operated in a common base circuit or gate circuit in that the input is connected to emitter or source, the output is connected to collector or drain, and base or gate is connected to a fixed potential. The respective alternative terms refer to a bipolar transistor on the one hand and to a FET on the other, in order to again show that the transistor is not limited to a specific technology. A common base circuit is superior to a more usual common emitter circuit, while in principle possible, because of a low input resistance, a higher band width, and a flatter frequency response.

The avalanche photo diode elements preferably comprise a first electrode and a second electrode used for biasing. This provides the bias voltage feeding the avalanche breakthrough.

A charging unit is preferably arranged between a respective avalanche photo diode element and the first electrode or the second electrode. The charging unit often will be a charge resistor, but may also be a current source.

The avalanche photo diode elements preferably comprise a third electrode as a capacitively coupled output for the Geiger current. Due to this third electrode independent from the provision of the bias voltage, a faster readout is possible. The third electrode preferably is connected between the avalanche photo diode element and the charging unit.

The input preferably is connected to the third electrode. The signal detection circuit thus makes use of the electrode for fast readout. On the other hand, adverse effects of the circuits for biasing on the readout anyway are suppressed by the coupling element according to the invention. That is why a fast readout is largely independent from the third electrode which therefore, in the alternative, may not be provided or not be used. Then, the signal detection circuit is connected to the first electrode or the second electrode.

Electronic circuits typically have a temporal latency, which more or less depends on various factors. In case that a circuit is used for a time measurement, these factors adversely affect the accuracy and reproducibility of a measurement in case of changing parameters such as temperature. Errors can be compensated to a certain degree by determining the interference parameters. Alternatively, the resulting error can be quantified during operation by suitable reference measurements, and the measuring result be corrected accordingly. Therefore, in an embodiment, an additional signal channel is provided at the input for capacitively feeding an additional signal into the signal detection circuit. A capacitive coupling downstream the photo detector conventionally has been associated with a reduction of the bandwidth due to the additional capacitance. However, using the invention which detects or taps the signal such that interference by capacitances is significantly reduced, the additional capacitance has no or very little impact on the signal quality of the actual measurement signal. In this way, for example, a reference signal, a test signal for checking or other test signals, or other data signals for instance of a second SPAD detector can be fed via the additional signal channel essentially free from interference.

In another embodiment of the invention, an optoelectronic sensor comprises at least one light detector as described above. The sensor is configured for at least one of distance measurement according to a light time of flight method, code reading and data transmission. Distance may be measured by triangulation, such as in a triangulation scanner or a stereo camera. Preferably, the distance is measured with a light time of flight method. In a pulse time of flight method, short light pulses are transmitted by a light transmitter, and the time until reception of a remission or reflection of the light pulse is measured. Alternatively, in a phase method, transmission light is amplitude modulated, and a phase shift between transmission light and reception light is determined, wherein the phase shift also is a measure for the light time of flight. The light time of flight method can be used in a one-dimensional distance scanner, a laser scanner, or an image sensor of a 3D camera according to the light time of flight principle. Some other non-exhaustive applications of the light receiver in an optoelectronic sensor are code reading or data transmission or combinations of these applications in a sensor.

The inventive method can be modified in a similar manner and shows similar advantages. Further advantageous features are described in the sub claims following the independent claims in an exemplary, but non-limiting manner.

BRIEF DESCRIPTION OF THE DRAWINGS

The invention will be explained in the following also with respect to further advantages and features with reference to exemplary embodiments and the enclosed drawing. The Figures of the drawing show in.

DETAILED DESCRIPTION

Figure 4A:
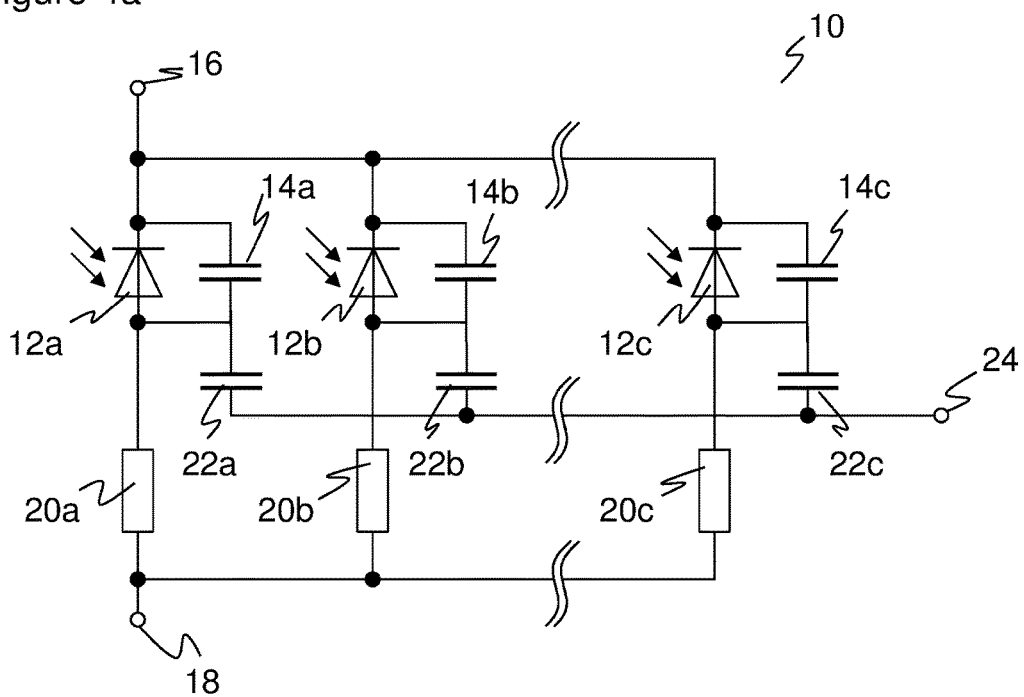
FIG. 4a an exemplary representation of the circuit elements of a SPAD detector.

FIG. 4a shows an example of a SPAD detector 10 having a plurality of avalanche photo diodes 12a-c whose capacitances are represented by parallel capacitors 14a-c. The avalanche photo diodes 12a-c are biased using a first electrode 16 and a second electrode 18 which ensure that the capacitors 14a-c are charged via charging resistors 20a-c. Coupling capacitors 22a-c connect the avalanche photo diodes to a third electrode 24 which is used for reading out a measurement signal from the SPAD detector 10. The readout via the third electrode 24 can have advantages, but is not mandatory.

The representation of the SPAD detector 10 is to be understood as an example and also simplified. The number of avalanche photo diodes 12a-c varies with the component and the requirements and can be up to several thousands and more. The avalanche photo diodes 12a-c usually form a matrix structure. A corresponding component can for example be manufactured in a CMOS process. The breakthrough voltage of the avalanche photo diode elements is considerably lower than for conventional avalanche photo diode elements, for example not more than 50V or 30V. The avalanche photo diodes 12a-c are electrically interconnected in groups or altogether. This enables statistical methods compensating for the fact that individual avalanche photo diodes 12a-c in Geiger mode on the one hand can already be inadvertently triggered by a single interfering photon and on the other hand cannot be activated for some time after having been triggered.

Figure 4B:
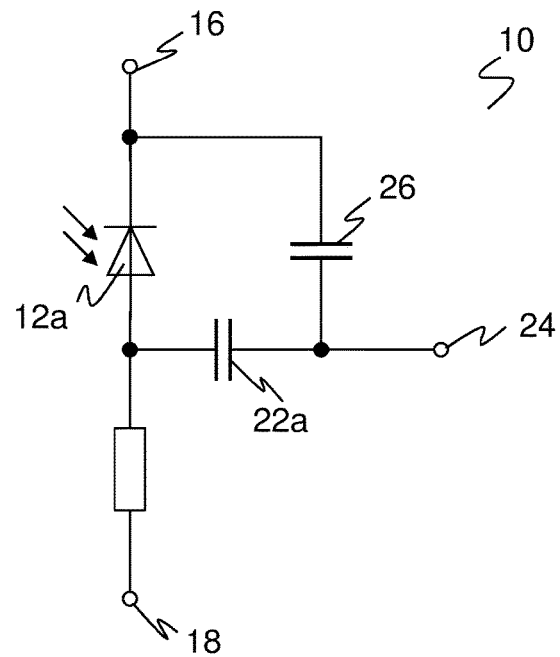
FIG. 4b a simplified equivalent circuit diagram for FIG. 4a, where only one avalanche photo diode is shown and the other avalanche photo diode elements are replaced with their effect as parasitic capacitances.

FIG. 4b shows a simplified equivalent circuit diagram for FIG. 4a from the perspective of a single avalanche photo diode. Its own capacitance is not shown as a parallel capacitor 14a for the sake of clarity. As throughout the specification, the same numbers are used for reference symbols of the same or corresponding features. The other avalanche photo diodes 12b-c are parasitic capacitances 26 from the perspective of the avalanche photo diode 12a, which even may be increased by other parasitic effects. The parasitic capacitance adds up from the usually large number of additional avalanche photo diodes 12b-c and can therefore be considerably larger than the capacitance of the associated capacitor 22a.

Upon light incidence, an avalanche breakthrough is triggered in the avalanche photo diodes 12a-c. A particularly interesting case is when only very little radiation power is to be detected, so that only one or some avalanche photo diodes 12a-c are triggered. In that case, the other avalanche photo diodes 12a-c are a relatively large capacitive load, attenuating and limiting the actual output signal in its bandwidth. The parasitic capacitance 26 acts as a low pass which block high-frequency signals.

Figure 5:
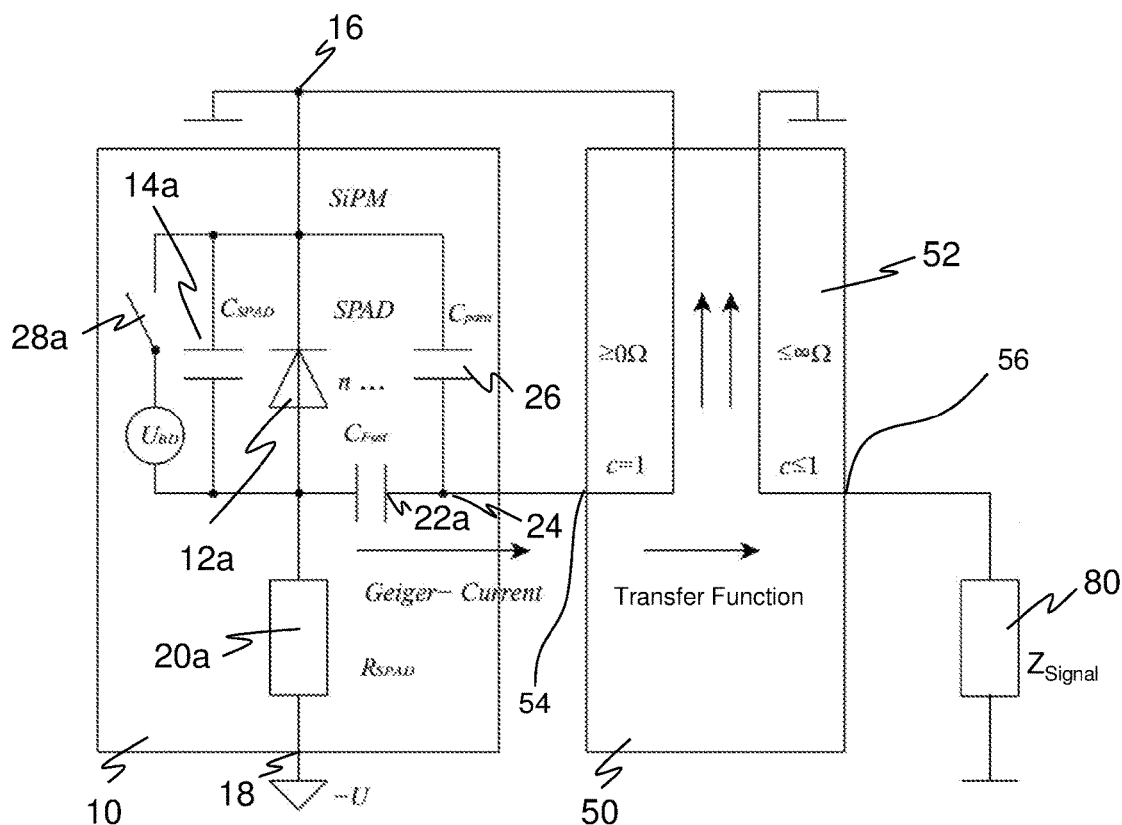
FIG. 5 a representation of an embodiment of a signal detection circuit for a SPAD detector having an active coupling element according to the invention.

FIG. 5 shows a SPAD detector 10 having a signal tap circuit or signal detection circuit 50 according to the invention, which in contrast to conventional solutions provides the measurement signal also for high frequencies in the GHz range and despite the parasitic capacitance 26.

The configuration of the SPAD detector 10 largely corresponds to the equivalent circuit diagram in FIG. 4b, but is again explained for a better understanding of the light reception with avalanche photo diodes in Geiger mode. The actual structure of the semiconductor device is assumed to be known and not shown. In the equivalent circuit diagram, the avalanche photo diode 12a shows as one aspect the behavior of a diode. It also has a capacitance, which is represented by the parallel capacitor 14a. An avalanche breakthrough is triggered by at least one incident photon, wherein this process acts like a switch 28a.

In a standby state, a voltage above the breakthrough voltage is applied to the avalanche photo diode 12a by means of the first electrode 16 and the second electrode 18. When an incident photon generates a charge carrier pair, this quasi closes the switch 28a, so that the avalanche photo diodes 12a is flooded with charge carriers, and a so-called Geiger currents flows. New charge carriers are only generated as long as the electric field remains strong enough. Once the capacitor 14a is discharged to a level below the breakthrough voltage, the avalanche is automatically stopped ("passive quenching"). Afterwards, the capacitor 14a is recharged from the electrodes 16, 18 via the resistor 20a, until a voltage above the breakthrough voltage again is provided for the avalanche photo diode 12a. There are alternative embodiments where the avalanche is detected from the outside, whereupon a discharge below the breakthrough voltage is triggered ("active quenching").

During the avalanche, the output signal increases rapidly and independently from the intensity of the triggering light to a maximum value and decreases after the quenching of the avalanche. The time constant of the decrease, which defines a dead time of the avalanche photo diode 12a, typically is in a range of a few to some few ten nanoseconds. The dead time is not an absolute dead time, because once the bias voltage is large enough to support an avalanche, the output signal can also rise again, but not to the same extent as in the standby state. The gain is up to $10^6$ and mainly is determined by the maximal number of charge carriers which can be recruited in the avalanche photo diode 12a.

The task of the signal detection circuit 50 is to derive a measurement signal from the Geiger current during an avalanche breakthrough preferably utilizing the complete current flow, in such a way that high-frequency components are preserved and a high signal-to-noise ratio is achieved. In FIG. 5, the signal detection circuit 50 is connected to the third electrode 24 and thus via the coupling capacitor 22a to the avalanche photo diode 12a. An alternative embodiment where the third electrode 24 is not used or not even provided is explained below with reference to FIG. 10.

The requirements for the signal detection circuit 50 are contradictory at first glance. In order to achieve high speeds or bandwidths, respectively, a very small signal resistance would be desirable ($Z_{Signal} \to 0$). At the same time, the signal resistance should be quite large for a high sensitivity ($Z_{Signal} \gg 0$).

Figure 1:
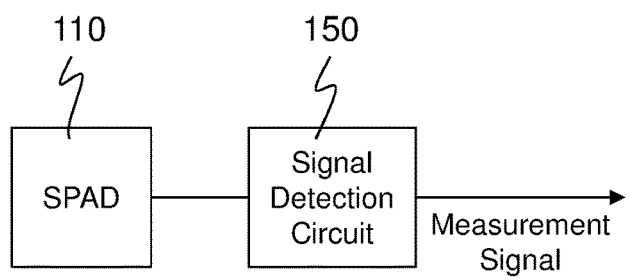
FIG. 1 a rough block diagram of a SPAD detector with a signal detection circuit.
Figure 2A:
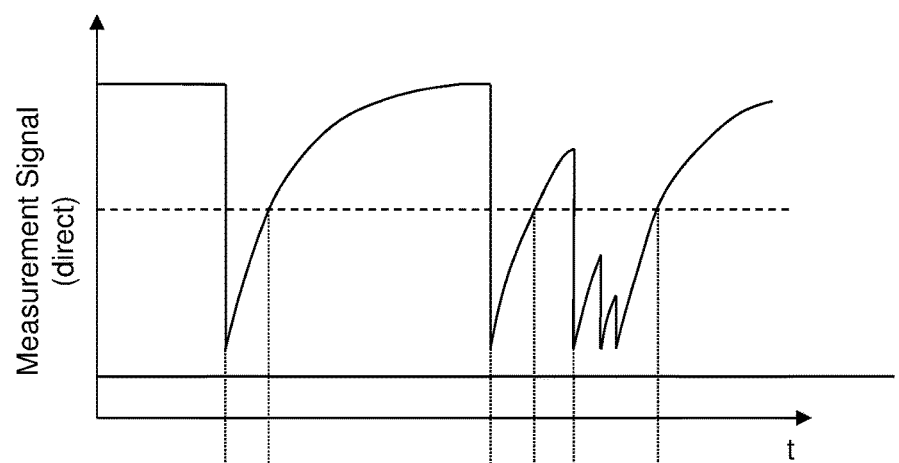
FIG. 2a the temporal course of a directly read out measurement signal of the SPAD detector.
Figure 2B:
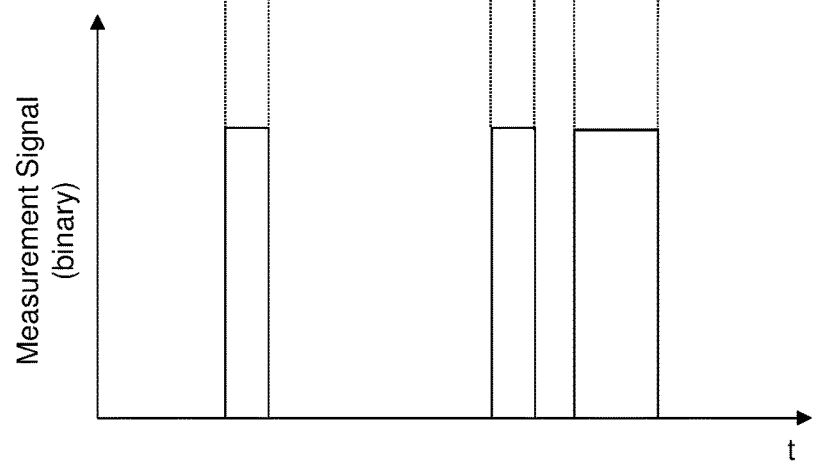
FIG. 2b a binary measurement signal after evaluating the SPAD signal with a threshold.
Figure 3A:
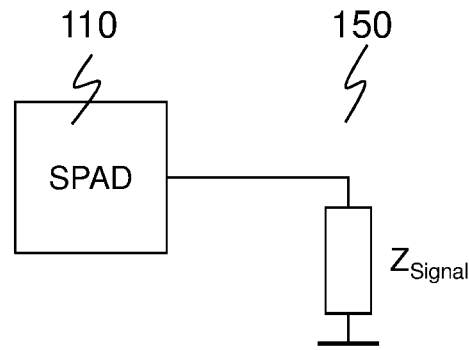
FIG. 3a a conventional signal detection circuit in the form of a measurement resistor.

The core aspect of the signal detection circuit 50 is an active circuit solution in the form of an active coupling element 52 which resolves this contradiction and is characterized by at least one of three properties. Firstly, it provides virtually no resistance for the Geiger current, which is capacitively tapped as a current pulse. This is shown as a quasi-short-circuit in the direction of the first electrode 16. The notation "$\geq 0\Omega$" is intended to indicate that such a virtual short-circuit with respect to a preferably fixed potential cannot be achieved completely in practice, but less than one Ohm is quite possible. This means that there are no relevant voltage fluctuations at $C_{para}$. This in turn prevents recharge processes in the parasitic capacitance 26, because the voltage remains virtually constant despite the avalanche, and correspondingly there is not current flow. All in all, almost the entire Geiger current flowing through the coupling capacitor 22a during an avalanche breakthrough is available to the active coupling element 52 at the input side. Without the virtual short-circuit with respect to a preferably fixed potential, as for example at an abrupt transition to a conventional measurement resistor as in FIG. 3a, a considerable part of the Geiger current would be lost in the parasitic capacitance 26, and especially the fast, high-frequency signal components would be suppressed due to the low pass behavior.

Secondly, the coupling element 52 at its output side generates a measurement current which corresponds to the Geiger current in its temporal course and level. The coupling element 52 may also modify, in particular amplify, the measuring current with respect to the Geiger current by its transfer function in a desired and specified manner. For that purpose, almost the entire current of the avalanche breakthrough is available at the coupling element 52. Other than for example in a transimpedance amplification, the mapping or transfer of the Geiger current to the measuring current is carried out in a single stage and therefore avoids the disadvantages discussed in the introduction. The measuring current is subsequently available at the output side as the detection result for further processing.

Thirdly, input circuit and output circuit are decoupled from one another. The further processing of the measuring current therefore has not impact on the Geiger current, within the technical limits of a real decoupling. Therefore, virtually any successor stages are possible, including a finite measurement resistor 80 for converting the measurement current into a signal voltage as shown in FIG. 5. There are no unfavorable feedback effects on the Geiger current as described in the introduction due to the decoupling.

Figure 6:
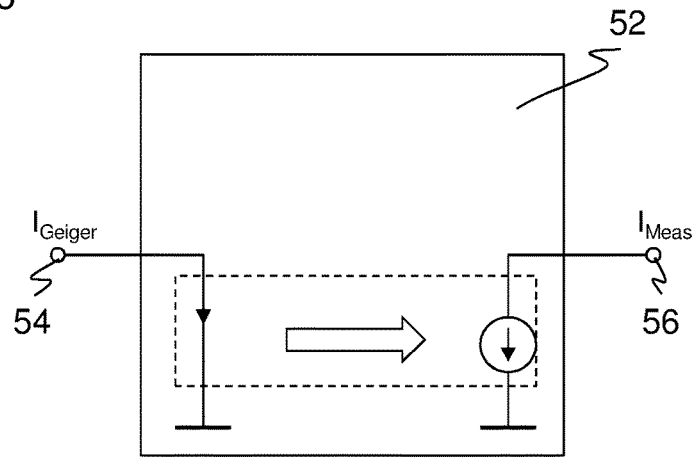
FIG. 6 an abstract model representation of the active coupling element.

FIG. 6 again shows the active coupling element 52 in an abstract model representation. At an input 54, the Geiger current flows almost freely from the SPAD detector 10 due to the virtual short-circuit. The active coupling element 52 maintains a constant voltage at the input 54 for that end. Recharging processes or current flows through the parasitic capacitance 26 cannot take place, the Geiger current is directly and completely led into the circuitry of the active coupling element 52. The measurement current is provided at an output 56. The coupling is exclusively in the direction from input 54 to output 56, the reverse direction is blocked and thus decoupled. The measuring current is fed by a current source of the active coupling element 52 and not by the SPAD detector 10. Signal modifications at the output side at most have a negligible effect on the input 54. The arrow connecting input 54 and output 56 represents a transfer function which may in particular include amplification.

Figure 7A:
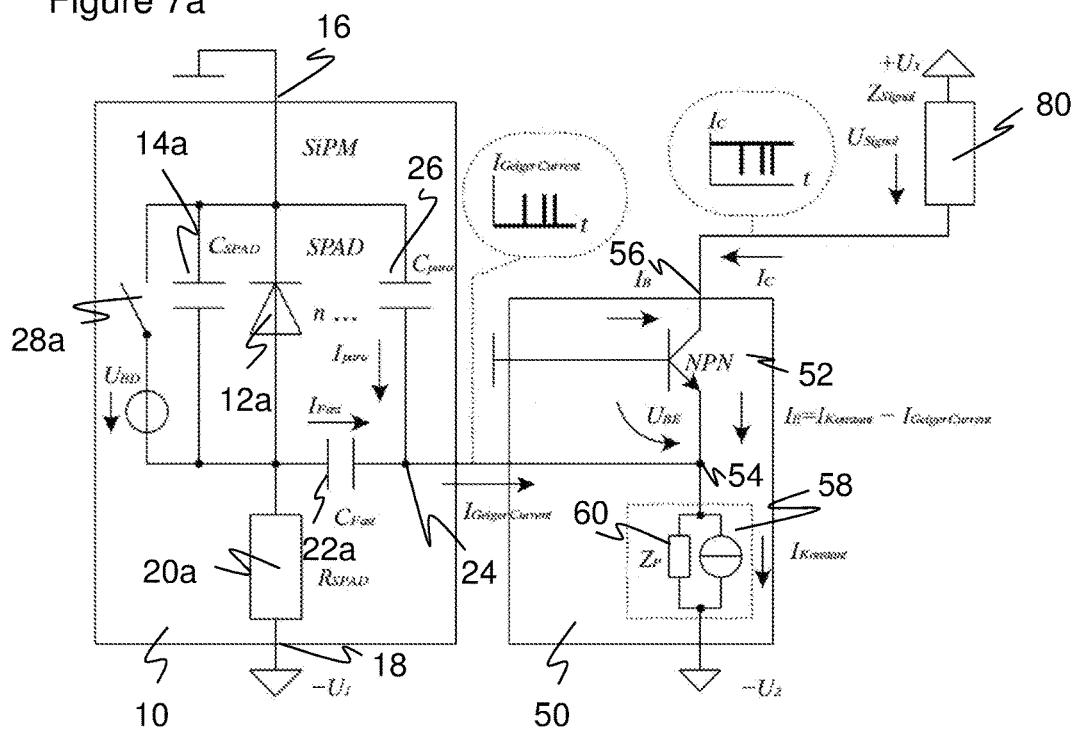
FIG. 7a a representation of another embodiment of the active coupling element according to the invention as a transistor in common base circuit.
Figure 7B:
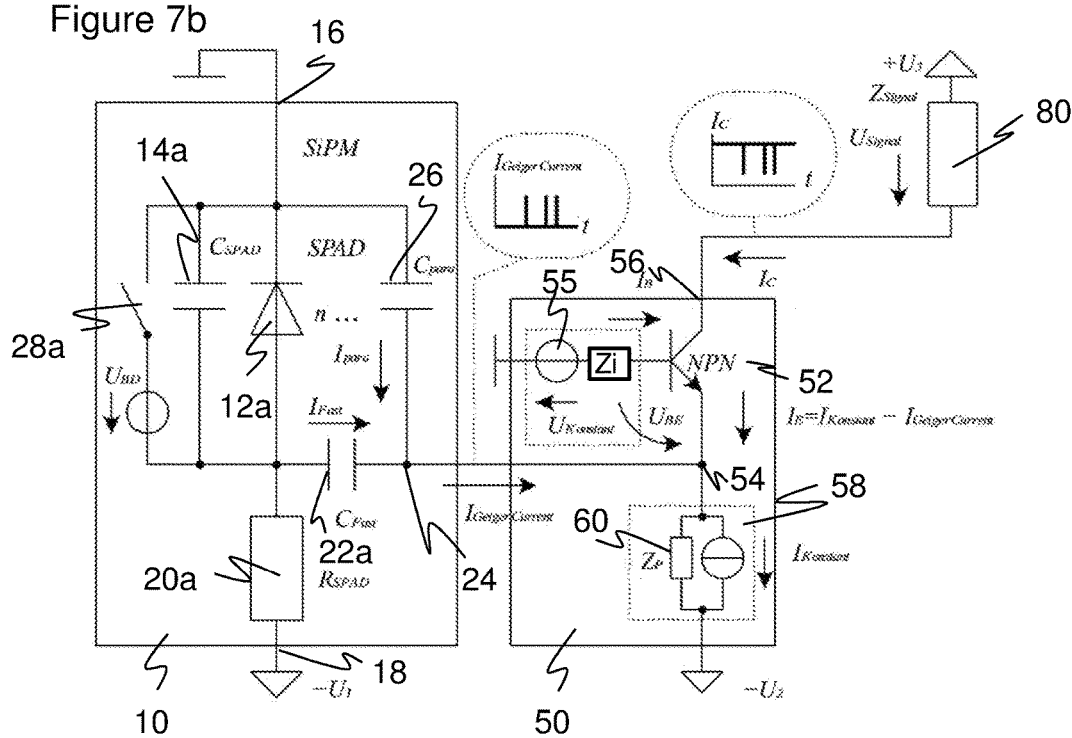
FIG. 7b a representation of the embodiment according to FIG. 7a with an additional voltage source at the base of the transistor.

FIGS. 7a and 7b show an embodiment of the signal detection circuit 50 whose active coupling element 52 is formed by one transistor. The signal detection circuit 50 is connected to the same SPAD detector 10 as in FIG. 5 with its input 54 via its third electrode 24 by way of example. The use of only one transistor means that it is a one-stage active tapping or detection circuit.

In this example, the transistor is a bipolar NPN transistor in common base circuit. The input 54, where the Geiger current is supplied from the third electrode 24, is formed by the emitter. The base is connected to ground, or more generally to a fixed potential which for example is provided by a voltage source 55 (FIG. 7b). The input 54 is AC shorted via emitter-base to a fixed potential, which in FIG. 7a is the ground potential. There could also be a voltage source at the base as shown in FIG. 7b. Then, the short-circuit is with respect to the fixed potential $U_{konstant}$. A possible impedance Zi of the voltage source is only marginally noticeable at the input 54 due to the gain of the transistor. In practice, Zi will be small. The impedance in the virtual short-circuit therefore should be as small as possible so that the effect of the short-circuit is optimal.

Figure 11:
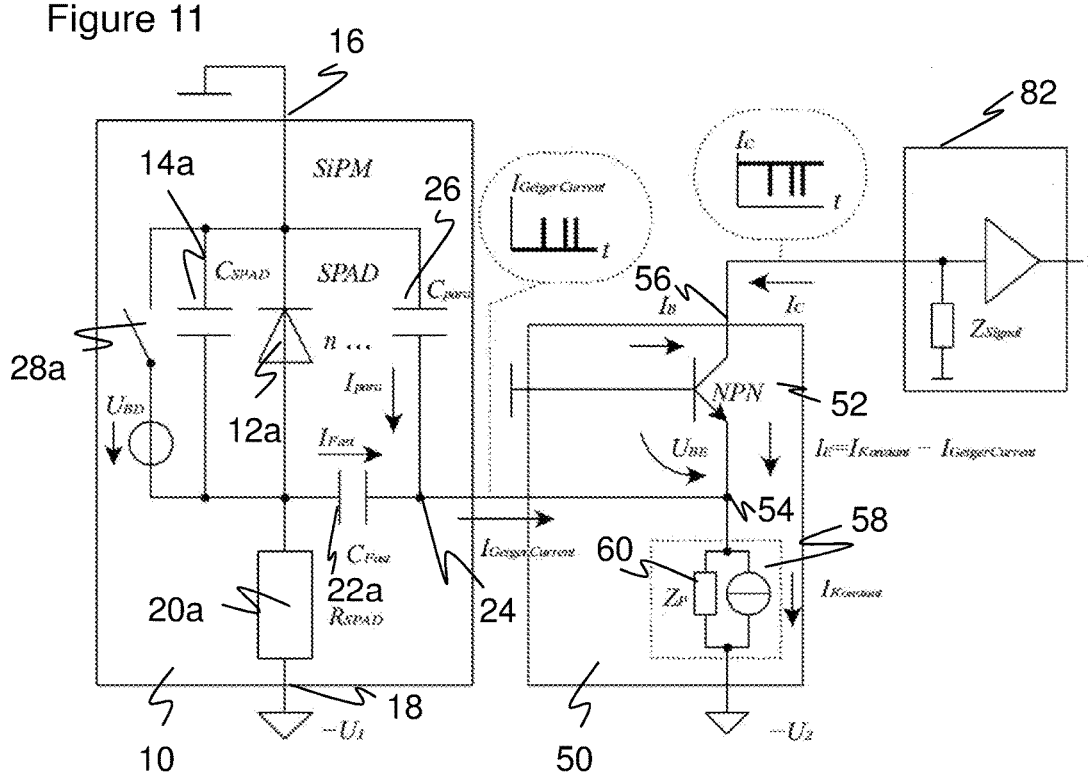
FIG. 11 a representation of a further embodiment according to the invention having an additional processing stage for the measuring current provided by the signal detection circuit.

The collector forms the output 56 where the measuring current is provided. In the emitter circuit of the transistor, there is also a constant current source 58 between input 54 and a supply voltage $-U_2$. Therefore, at any time other than during avalanche breakthroughs, there flows a continuous current which sets the operating point of the transistor. The constant current source 58 can also be passively implemented by a resistor 60. In the Figures, constant current source 58 and resistor 60 are shown in parallel and may be implemented alternatively or together. At the output 56, the measuring current is tapped via a measuring impedance, which in FIGS. 7a and 7b is shown as a simple impedance 80. As an alternative, the measuring impedance 80 may also be implemented as a measurement circuit with active and/or passive elements (FIG. 11).

The situation at the transistor will now be described firstly in a basic state (DC operating point) and then during an avalanche breakthrough (AC operating point).

In the basic state, emitter current $I_E$, base current $I_B$ and collector current $I_C$ satisfy the relations $I_E=I_B+I_C$ sowie $I_B=I_C/B$, wherein B is the gain.

Substituting the second equation into the first equation, $I_E=I_C*(1/B+1)$, and solving for the collector current IC results in $$I_C=I_E/(1/B+1)=(I_{Konstant}-I_{GeigerCurrent})/(1/B+1).$$

In this last step, the respective parameters of FIGS. 7a and 7b are used for the emitter current. Here, only a standby current flows through the transistor which is given by the current source 58 as $I_{Konstant}$. A fast signal current $I_{GeigerCurrent}$ has almost no effect in the basic state. The constant current in the emitter circuit is thus transferred into the output circuit at the collector side of the transistor with almost the same magnitude.

During an avalanche breakdown, i.e. when an avalanche photodiode 12a is triggered by incident light, or also by an interference event, a positive current pulse $I_{Fast}$ flows via the coupling capacitor 22a, the third electrode 24 and the input 54 to the emitter circuit of the transistor. This essentially is the Geiger current, to the extent it is possible to suppress the parasitic effects and thus a current $I_{Para}$. The constant current $I_{Konstant}$ ideally remains unaffected. Then, it holds $$I_E = I_{Konstant} - I_{GeigerCurrent} \text{ and hence } I_{Konstant} = I_E + I_{GeigerCurrent}$$

so that the Geiger current is almost identically transferred onto the emitter current $I_E$.

For the further processing of the fast variations of the emitter current, the transistor should be a suitable high frequency transistor whose high frequency gain or differential current gain $\beta$ satisfies the condition $B \approx \beta \gg 1$. Such high frequency transistors with transition frequencies in the range of several 10 GHz are available. Under this condition, the above equation for the basic state can also be used for the high-frequency signal currents by replacing B with $\beta$:

$$I_C = I_{Konstant} - I_{GeigerCurrent}/(1/\beta + 1).$$

This means that the collector current and thus the measuring current at the output 56 almost corresponds to the emitter current also for high-frequency input signals. The base-emitter voltage undergoes only very small variations because the base current is significantly reduced by the current gain factor of the transistor. Therefore, the current $I_{Para}$ of the parasitic capacitance 26 ideally is completely suppressed, and it is justified to equate the Geiger current $I_{GeigerCurrent}$ with $I_{Fast}$ and thus with the emitter current. In summary, the Geiger current is mapped to the measuring current.

Figure 8:
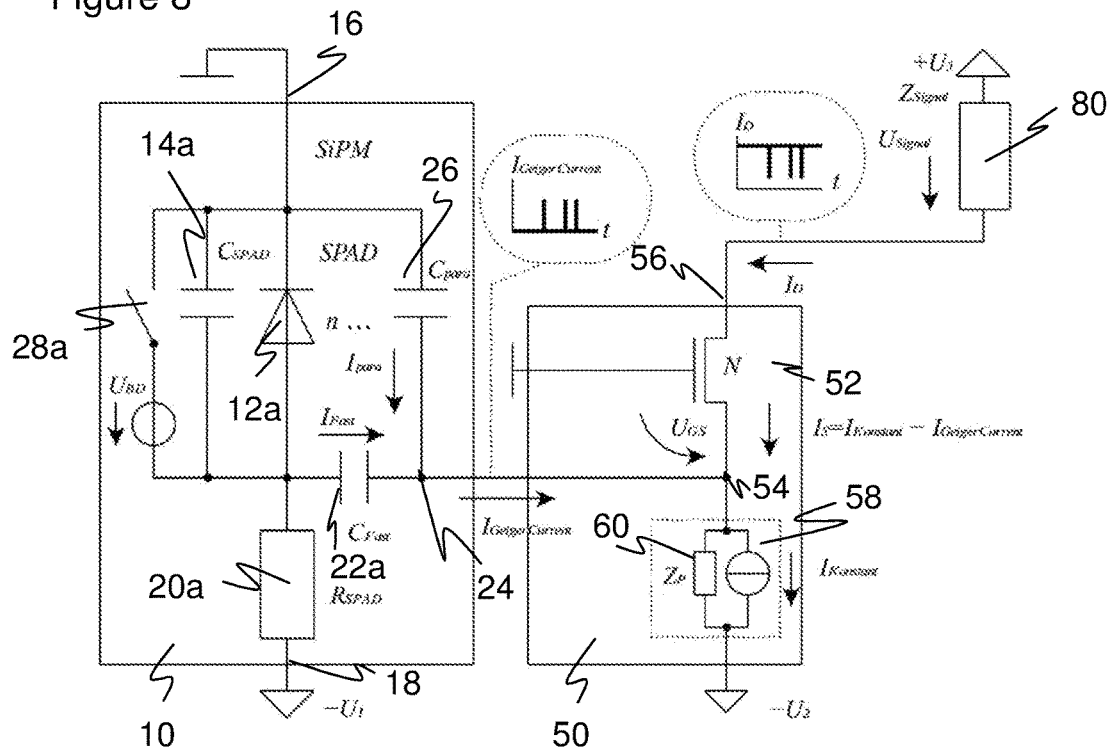
FIG. 8 a representation of an alternative embodiment of the active coupling element according to FIG. 7 having a field effect transistor instead of a bipolar transistor.

FIG. 8 shows an alternative embodiment of the signal detection circuit 50 which differs from the embodiment according to FIG. 7 in that the transistor is a field effect transistor (FET) instead of a bipolar transistor. In the illustrated case, it is an N-FET in common gate circuit, i.e. where the gate is connected to a fixed potential, source to the input 54 and drain to the output 56.

The source current in this case is the difference of the constant current of the current source 58 and the Geiger current. When neglecting the gate current, the drain current is equal to the source current, so that the drain AC component being the measurement current corresponds to the inverted Geiger current. The approximation is valid to the extent that the voltage $U_{GS}$ at the input 54 actually can be maintained constant, which in turn can be inferred from the characteristic curves of the FET.

FIG. 8 illustrates that the active coupling element 52 is not limited to a particular type of transistor. This also applies to the transistor polarity, i.e. use of a PNP transistor or a P-FET is also possible, given due consideration to the polarity for example with respect to the supply voltage.

A common base circuit as in FIGS. 7a and 7b and a gate circuit as in FIG. 8, respectively, have advantages, but are not mandatory. For example, a bipolar transistor may also be connected in common emitter circuit. Then, the emitter for example of an NPN transistor is connected to ground. A load resistor leads from the collector to a positive supply voltage source. The operating point between collector and base is set by a high-resistance resistor. The Geiger current is supplied to the base via a coupling capacitor. A feedback network comprising a series connection of a resistor, a capacitor, and an inductor is additionally connected between collector and base. The resistance determines the AC gain in a mid-frequency range and the input resistance, while the inductance reduces the feedback effects and thus increases the gain of the stage for high frequencies. The capacitor in the feedback network is only for DC separation. This circuit configuration is not as powerful as the common base circuit because the input resistance is larger. Additional disadvantages are the limited bandwidth and the frequency response which is not as flat as compared to the common base circuit. The same applies to a FET in common source.

As can be inferred from the embodiments as explained, there are several possibilities for a circuitry implementation of the active coupling element 52. In general, any active circuit block which has a low input impedance similar to a short-circuit or offers the possibility to maintain the voltage potential at the input at least almost constant can be used. The output stage may have a current character as in the examples, but also a voltage character. The resistors used in the signal detection circuit 50 can have resistive or complex properties. All reference potentials are only by way of example, and variations are also possible at the reference points, such as ground reference of the SPAD detector 10, ground reference of the signal detection circuit 50, or zero potential of output and supply voltage.

There are various embodiments of the invention not only for the active coupling element 52, but also for the circuitry of the avalanche photo diode 12a and the connection of the signal detection circuit 50, which are now described. The SPAD detector 10 is also called silicon photo multiplier (SiPM) in the Figures. This does not limit its function in any way nor define the semiconductor to be silicon, because other semiconductor materials are also possible.

Figure 9:
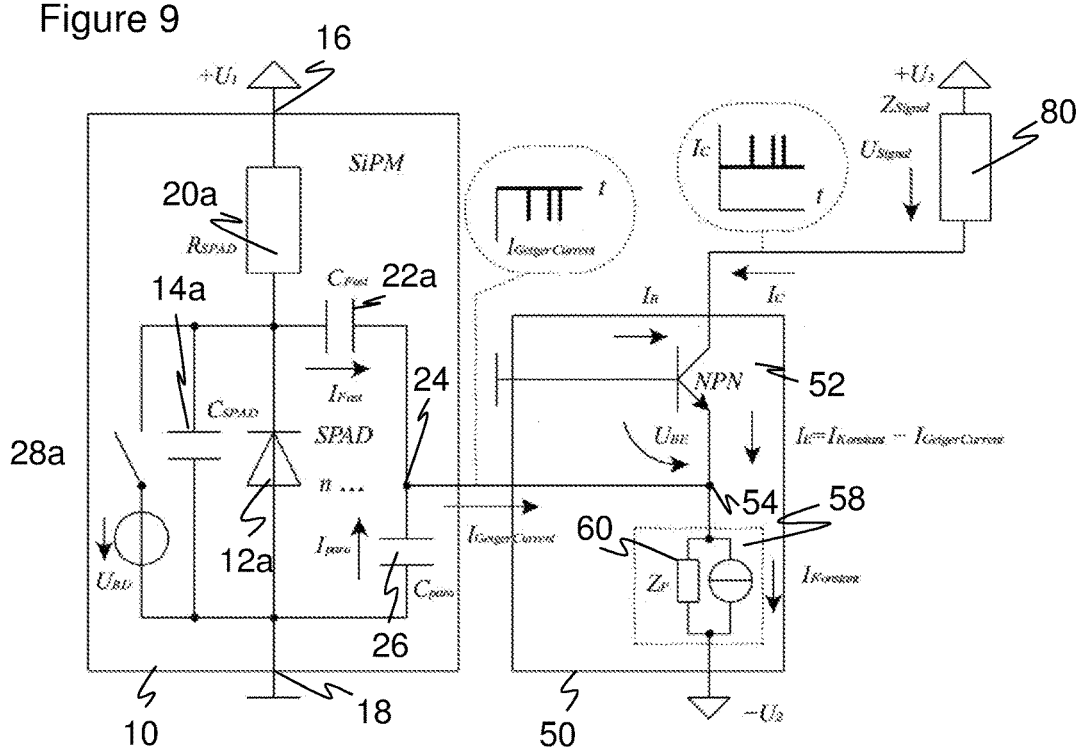
FIG. 9 a representation of a further embodiment of a signal detection circuit according to the invention in a modified arrangement of the capacitive coupling.

Further, the load resistor 20a may be connected at the cathode side as in FIG. 9 instead of at the anode side. The function is quite similar, although the supply voltage for the bias voltage now has positive polarity. The Geiger current is negative and leads to an increase of the current through the active coupling element 52. The polarity of the measuring current at the output 56 therefore is negative.

In the examples shown so far, the signal detection circuit 50 is connected to the third electrode 24. The tap or connection in principle can be at any electrode, i.e. the first electrode 16, the second electrode 18, or the third electrode 24, for example to take account of specific features of the SPAD detector 10 or the signal detection circuit 50. For a signal tap at the anode or cathode side, the third electrode 24 may be used as a reference connection and for example be connected to ground or other reference potential. Depending on whether the first electrode 16 or the second electrode 18 is used as connection for the signal detection circuit 50, the load resistor should change position from the second electrode 18 to the first electrode 16 as between FIGS. 7a and 7b and FIG. 9 or vice versa.

Figure 10:
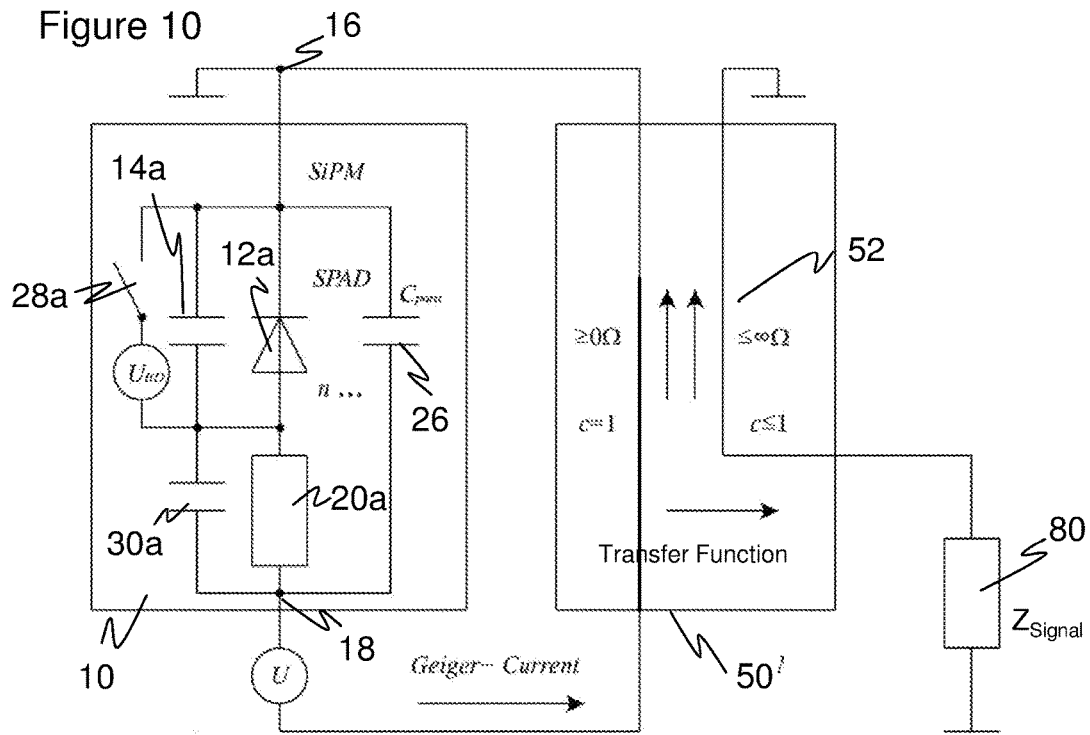
FIG. 10 a representation of a further embodiment of a signal detection circuit according to the invention which is connected to an electrode for biasing the SPAD detector instead to a dedicated readout electrode.

In a further alternative, there is no third electrode 24. FIG. 10 shows a corresponding example of a SPAD detector 10 with only two connections and a signal detection circuit 50 being connected to the second electrode 18. The load resistor 20a is bypassed for AC signals by a parallel capacitor 30a. The Geiger current is tapped between the two electrodes 16, 18 of the SPAD detector 10, while in this example the voltage source for the biasing voltage is also connected in series. The coupling may alternatively use an additional coupling network comprising a resistor and a coupling capacitor.

The SPAD detector with its external circuitry is virtually shorted for AC signals. Therefore, there is no notable output AC voltage even when an avalanche breakthrough is triggered. Without relevant voltage variations at the electrodes 16, 18 of the SPAD detector 10, the voltage at the parasitic capacitance 26 remains almost constant. Consequently, there are virtually no recharging processes, and the complete Geiger current is available at the input 54. The active coupling element 52 operates as described above.

Figure 3B:
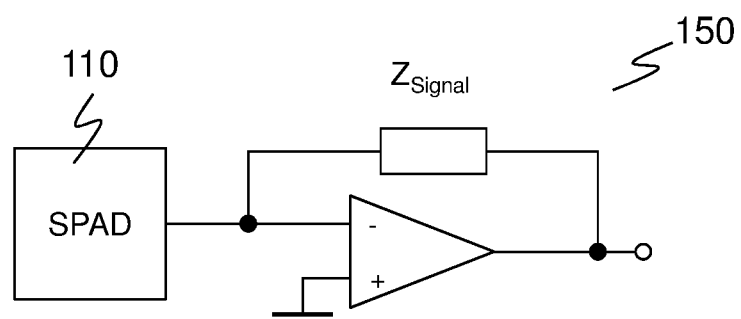
FIG. 3b a conventional signal detection circuit in the form of a transimpedance amplifier.
Figure 3C:
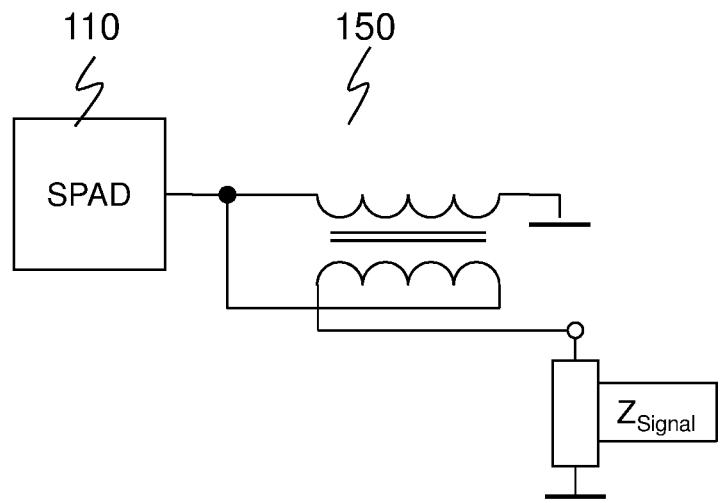
FIG. 3c a conventional signal detection circuit in the form of a transformer.

Due to the decoupling of measuring current and Geiger current in the active coupling element 52, the further processing of the measuring current almost has no impact on the Geiger current to be read out. While only a simple measurement resistor 80 has been shown for the previous embodiments, FIG. 11 illustrates an alternative where there is a further processing stage 82 for signal processing at the output side. This fundamentally differs from a convention transimpedance amplifier according to FIG. 3*b*, because there the stages are coupled among one another. In FIG. 11, the amplification stage is functionally separated from the signal detection.

The further processing stage 82 in FIG. 11 is only an example and may be configured in various ways. Thus, the further processing stage 82 may be configured as a measurement circuit having active and/or passive elements.

Figure 12:
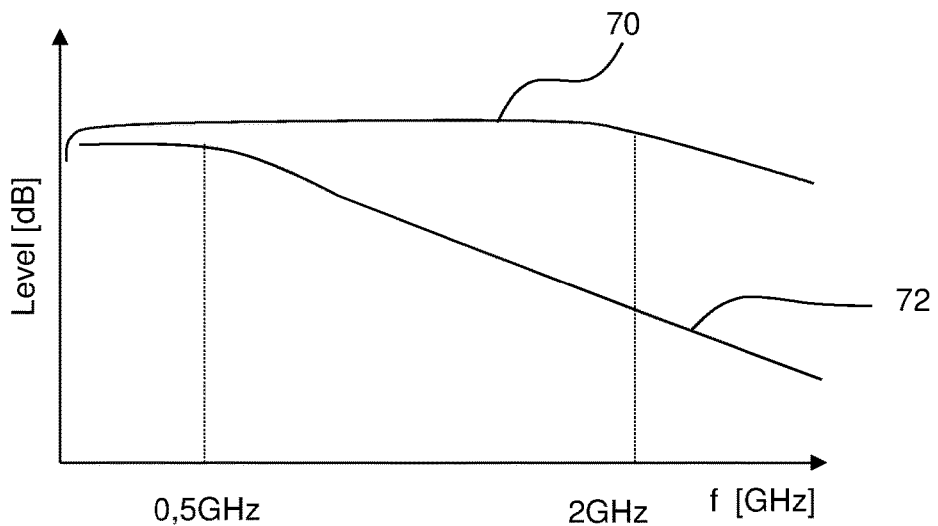
FIG. 12 a comparison of the frequency response of a conventional signal detection circuit and a signal detection circuit according to the invention.
Figure 13:
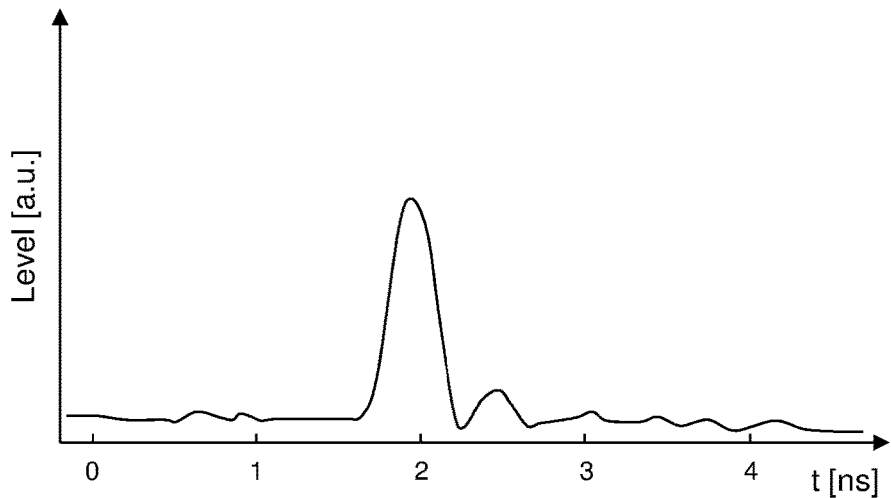
FIG. 13 an exemplary representation of a short light pulse which has been read out by a signal detection circuit according to the invention.

FIGS. 12 and 13 qualitatively illustrate the significantly improved high frequency behavior of the invention. FIG. 12 shows the result of a test implementation where a laser transmits a signal which is modulated in its amplitude with a frequency varying from 100 kHz to 3 GHz onto the SPAD detector 10. The upper curve 70 shows the result of a signal detection according to the invention, while the lower curve 72 shows a conventional signal detection for comparison. The frequency response 70 of the configuration according to the invention is very flat with a bandwidth of 2 GHz, and a significant decrease of the signal occurs only for frequencies beyond 2-3 GHz. Compared to the prior art where the measurement signal already collapses for moderate frequencies well before the GHz range, this is a multiplication of the range.

Following this discussion in the frequency domain, FIG. 13 shows another example in the time domain. Here, the SPAD detector 10 has been excited with a short individual pulse having a pulse width of 250 ps. FIG. 13 shows the pulse response at the output 56, in this example the collector of a bipolar transistor. The pulse width is 340 ps. The circuit therefore is capable of detecting very short pulses significantly less than one nanosecond.

The embodiments of the signal detection circuit 50 as presented can be implemented in semiconductor technology and may also be integrated on a semiconductor level together with the actual SPAD detector 10 in a common component. Single and multichip solutions are possible, wherein the process in principle is open and may for example be a bipolar or a MOS process.

Figure 14:
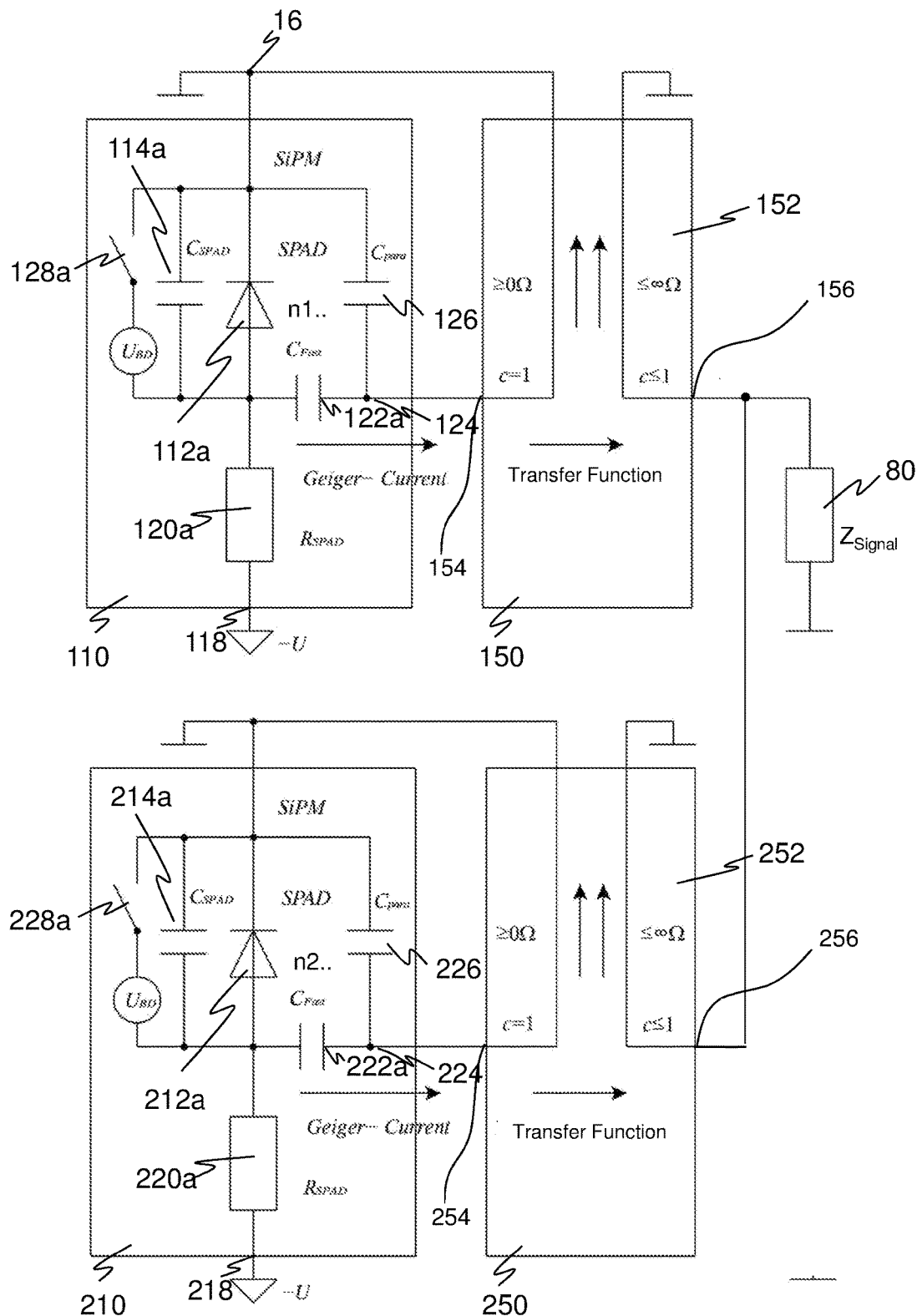
FIG. 14 a representation of a further embodiment according to the invention with a partitioning of the avalanche photo diodes.

In a further embodiment of the invention, several, i.e. two or more, light detectors according to the invention may be quasi-interconnected as shown in FIG. 14. "Quasi-interconnected" means that a first SPAD detector 110 having n1 avalanche photo diodes 112*a-c* with a downstream first signal detection circuit 150 and a second SPAD detector 210 having n2 avalanche photo diodes 212*a-c* with a downstream second signal detection circuit 250 are connected to a common measurement circuit at their outputs 156 and 256. The measurement circuit may be a simple passive impedance 80 or an active processing stage (like 82 above).

This "partitioning" of all n1+n2 SPADs (avalanche photo diodes) in several (here, two) groups has several advantages. By partitioning into units having less SPADs, there are smaller capacitances resulting in achieving higher frequencies. Due to the smaller capacitances, there are smaller currents, so that the transistors in the signal detection circuits 150 and 250 can be made smaller and thus are not only cheaper, but also more easily (more compact) integrated on a chip. Another advantage achieved by the partitioning is a possible transit time optimization on the chip. Distances of the components on the chip defining the transit times can be configured in an optimized way.

Figure 15:
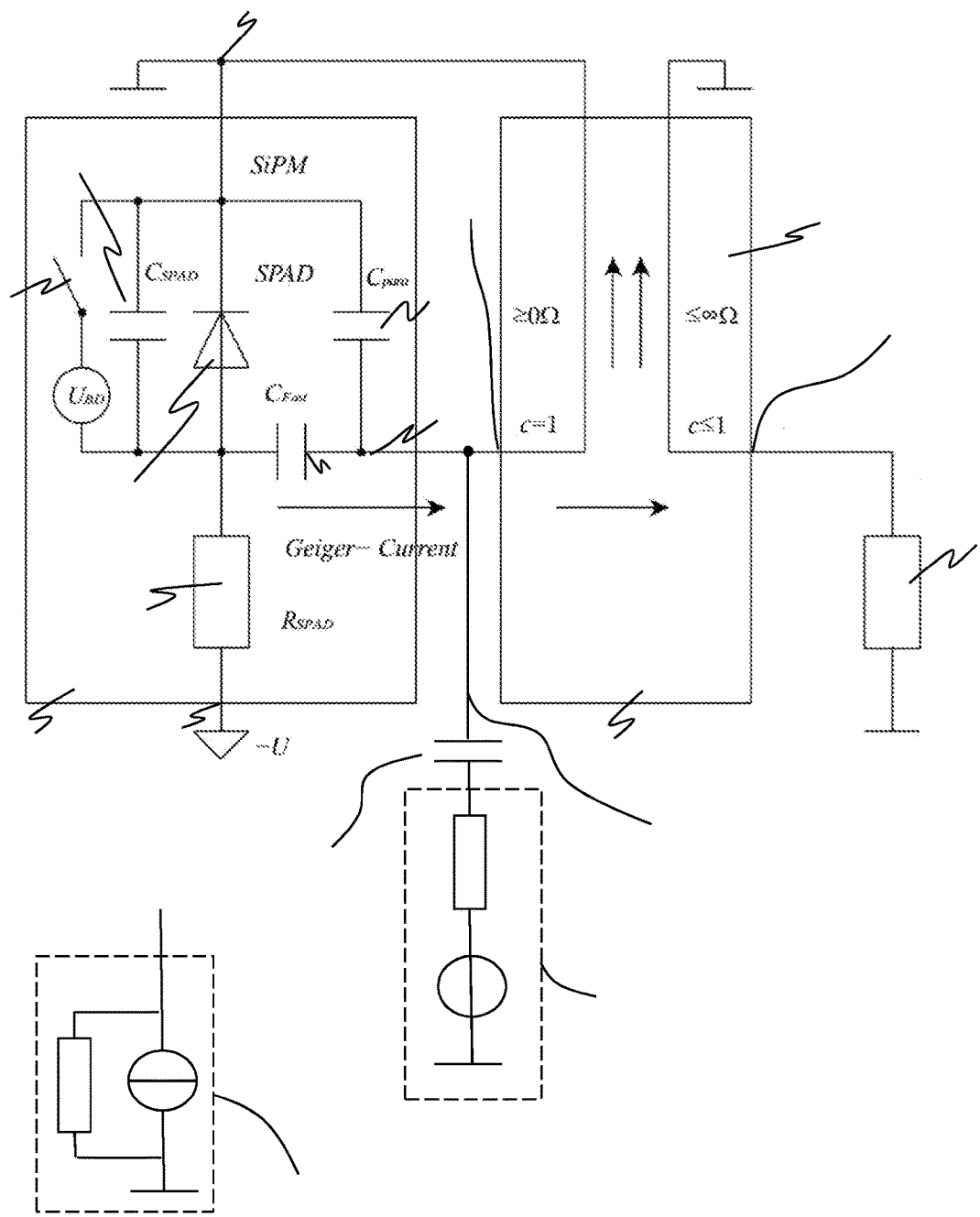
FIG. 15 a representation of a further embodiment according to the invention having an additional signal feed.

In a further embodiment of the invention, as shown in FIG. 15, an additional signal channel 90 is provided at the input 54, where an additional signal may be fed or supplied to the signal detection circuit 50. The signal, which for example may be generated by a voltage source 94 or in the alternative by a current source 96, is capacitively coupled into the input via a capacitor 92. Such capacitive coupling downstream the photo detector conventionally implied a limitation of the bandwidth by the additional capacitance 92. However, according to the invention which detects or taps the signal so that interference by capacitances is significantly reduced, the additional capacitance 92 has no or very little effect on the signal quality of the actual measurement signal. Thus, for example a reference signal, a test signal for checking or other test signals, or other data signals for instance of a second SPAD detector 10 can be fed via the additional signal channel 90.

The invention claimed is:

1. A light receiver (10, 50) having a plurality of avalanche photo diode elements (10, 12*a-c*) which are biased with a bias voltage greater than a breakthrough voltage and are thus operated in a Geiger mode in order to trigger a Geiger current upon light reception, and having a signal detection circuit (50) for reading out the avalanche photo diode elements (10, 12*a-c*), wherein the signal detection circuit (50) comprises an active coupling element (52) having an input (54) connected to the avalanche photo diode elements (10, 12*a-c*) and an output (56), the active coupling element (52) mapping the Geiger current at the input (54) to a measuring current corresponding to the Geiger current in its course and level, wherein the input (54) forms a virtual short-circuit for the Geiger current with respect to a potential (ground, $-U_{BE}$; $U_{const}-U_{BE}$), and the output (56) is decoupled from the input (54).

2. The light receiver (10, 50) according to claim 1, wherein the course of the measuring current deviates from the Geiger current only for fluctuations in a higher Gigahertz range.

3. The light receiver (10, 50) according to claim 2, wherein the course of the measuring current deviates from the Geiger current only for fluctuations in a range above 2 Ghz or 3 GHz.

4. The light receiver (10, 50) according to claim 1, wherein a measurement circuit is connected to the output (56).

5. The light receiver (10, 50) according to claim 1, wherein the signal detection circuit (50) comprises a constant current source (58) connected to the coupling element (52) for setting its operating point.

6. The light receiver (10, 50) according to claim 1, wherein the signal detection circuit (50) comprises a resistor (60) connected to the coupling element (52) for setting its operating point.

7. The light receiver (10, 50) according to claim 1, wherein the coupling element (52) is configured to maintain a constant voltage at the input (54) side.

8. The light receiver (10, 50) according to claim 1, wherein the coupling element (52) comprises exactly one transistor.

9. The light receiver (10, 50) according to claim 8, wherein the transistor is operated in a common base circuit or gate circuit in that the input (54) is connected to emitter or source, the output (56) is connected to collector or drain, and base or gate is connected to a fixed potential.

10. The light receiver (10, 50) according to claim 1, wherein the avalanche photo diode elements (10, 12*a-c*) comprise a first electrode (16) and a second electrode (18) used for biasing.

11. The light receiver (10, 50) according to claim 10, wherein a charging unit (20*a-c*) is arranged between a respective avalanche photo diode element (12*a*) and the first electrode (16) or the second electrode (18).

12. The light receiver (10, 50) according to claim 10, wherein the avalanche photo diode elements (10, 12*a-c*) comprise a third electrode (24) as a capacitively coupled output for the Geiger current.

13. The light receiver (10, 50) according to claim 12, wherein the input (54) is connected to the third electrode (24).

14. The light receiver (10, 50) according to claim 1, wherein an additional signal channel is provided at the input (54) for capacitively feeding an additional signal into the signal detection circuit (50).

15. An optoelectronic sensor comprising at least one light detector (10, 50) having a plurality of avalanche photo diode elements (10, 12*a-c*) which are biased with a bias voltage greater than a breakthrough voltage and are thus operated in a Geiger mode in order to trigger a Geiger current upon light reception, and having a signal detection circuit (50) for reading out the avalanche photo diode elements (10, 12*a-c*), wherein the signal detection circuit (50) comprises an active coupling element (52) having an input (54) connected to the avalanche photo diode elements (10, 12*a-c*) and an output (56), the active coupling element (52) mapping the Geiger current at the input (54) to a measuring current corresponding to the Geiger current in its course and level, wherein the input (54) forms a virtual short-circuit for the Geiger current with respect to a potential (ground, $-U_{BE}$; $U_{const}-U_{BE}$), and the output (56) is decoupled from the input (54), wherein the sensor is configured for at least one of distance measurement according to a light time of flight method, code reading and data transmission.

16. A readout method for avalanche photo diode elements (10, 12*a-c*) which are biased with a bias voltage greater than a breakthrough voltage and are thus operated in a Geiger mode and trigger a Geiger current upon light reception, wherein the Geiger current flows through a connection between avalanche photo diode element (10) and an input (54) of an active coupling element (52) due to a virtual short-circuit with respect to a potential (ground, $-U_{BE}$; $U_{const}-U_{BE}$), wherein, in the coupling element (52), the Geiger current is mapped to a measuring current corresponding to the Geiger current in its course and level at an output (56) of the coupling element (52), and wherein the output (56) is decoupled from the input (54) so that the Geiger current is unaffected by further processing of the measuring current.

* * * * *